United States Patent [19]
Luber

[11] Patent Number: 5,355,130
[45] Date of Patent: Oct. 11, 1994

[54] ULTRASONIC PROXIMITY SWITCH WITH A SYNCHRONIZING DEVICE

[75] Inventor: Ernst Luber, Holnstein, Fed. Rep. of Germany

[73] Assignee: Siemens Aktiengesellschaft, Munich, Fed. Rep. of Germany

[21] Appl. No.: 893,438

[22] Filed: Jun. 4, 1992

[30] Foreign Application Priority Data

Jun. 13, 1991 [EP] European Pat. Off. ........ 91109721.0

[51] Int. Cl.$^5$ ..................... G01S 15/00; G08C 15/08; H03L 7/00
[52] U.S. Cl. .................... 340/870.14; 340/825.14; 340/825.2; 340/870.24; 307/269; 307/253; 307/308; 367/93; 367/95
[58] Field of Search ............. 340/870.14, 870.24, 340/825.14, 825.2; 307/105, 106, 308, 253, 269; 367/93–95

[56] References Cited

U.S. PATENT DOCUMENTS

| | | | |
|---|---|---|---|
| 4,628,493 | 12/1986 | Nelson et al. | 340/870.14 |
| 4,649,527 | 3/1987 | Forster et al. | 369/93 |
| 5,023,600 | 6/1991 | Szklany et al. | 340/825.14 |
| 5,118,963 | 6/1992 | Gesin | 307/116 |
| 5,144,593 | 9/1992 | Forster et al. | 367/95 |
| 5,198,810 | 3/1993 | Harel | 340/825.14 |

OTHER PUBLICATIONS

Honeywell Geräte–Information E108, DB–1067.2, *Serie 945 Ultraschall–Abstandssensoren*.
N.T.I.S. Tech Notes, Apr. 1988, Springfield, Va., US, p. 259; *Ultrasonic Ranging System With Increased Resolution*, National Aeronautics and Space Admin.
IEEE Transactions on Consumer Electronics, vol. CE–25, No. 4, Aug. 1979, New York, US, pp. 440–445. Ozawa et al.: *New portable video casette recorder*.

*Primary Examiner*—John K. Peng
*Assistant Examiner*—Daniel J. Wu
*Attorney, Agent, or Firm*—Kenyon & Kenyon

[57] ABSTRACT

When operating adjacent ultrasonic proximity switches, faulty output states can occur due to mutual interference (e.g., the incorrect allocation of echo signals). To solve this problem, it is known to adhere to standard mounting specifications as well as to apply parallel or serial synchronization. Ultrasonic proximity switches with an enabling output and a microprocessor are improved by inserting a circuit arrangement between these two elements, which, based on synchronizing pulses, produces a change in potential from high to low at the enabling output. By connecting the enabling outputs of several proximity switches constructed in this manner and operated adjacent to one another through a shared line, an improved operation with parallel and serial synchronization is possible without external control (i.e., automatically). The low potential state produced by an ultrasonic proximity switch at its enabling output is supplied via the line to the remaining connected ultrasonic proximity switches. While the line is at low potential, at least one proximity switch is not yet ready to transmit, that is only the change to high potential enables the parallel synchronization or, alternatively, introduces serial synchronization.

6 Claims, 2 Drawing Sheets

ULTRASONIC PROXIMITY SWITCH WITH A SYNCHRONIZING DEVICE

BACKGROUND OF THE INVENTION

The present invention relates to an ultrasonic proximity switch with an enabling output, which is connectable via a shared line to the enabling output of at least one additional ultrasonic proximity switch, and with an open-loop control block containing one input and one output.

When adjacent ultrasonic proximity switches operate, mutual interference can occur due to unfavorable reflections of the ultrasound in the surround field of the proximity switches. The echo-time measurement of an ultrasonic proximity switch is disturbed by the echo signal from a neighboring ultrasonic proximity switch when the ultrasonic proximity switches do not transmit synchronously. Therefore, correctly allocating the echo signals to those ultrasonic proximity switches which have output the corresponding initial pulses may not be possible. Since the switching output is set to be indefinite, echo-time evaluation errors occur.

Up until now, the known method for solving the above problem was to operate ultrasonic proximity switches serially, by cyclically connecting or disconnecting the voltage supplies to the ultrasonic proximity switches. The response time of the ultrasonic proximity switches is increased when this technique is used and is further delayed by internal reset times. Another wave mutual interference has been avoided up until now was to observe the standard mounting specifications, i.e., the specified minimum clearances for installing the ultrasonic proximity switches. However, the minimum clearances depend on the application desired. When avoiding mutual interference with a high degree of certainty is required, this method must be ruled out for many applications. Another solution for avoiding the mutual interferences consists in interconnecting the ultrasonic proximity switches by a shared line, so that a parallel synchronization takes place through this line. Another solution for avoiding mutual interference consists of interconnecting the adjacent operated proximity switches via their enabling output by a shared line so that a parallel synchronization takes place through this line. In this case, initial pulses are emitted at the same instant by all proximity switches, thereby mooting the problem of allocating the echo signals in a temporally correct manner to the respective ultrasonic proximity switches. Such a parallel synchronization is known, for example, from the company pamphlet (Honeywell MICRO SWITCH Units Information E 108/DB1067.2). However, with those proximity switches the echo-time evaluation of the unit does not contain any arranged evaluation algorithms and the unit is therefore fault-sensitive. Further, those proximity switches are not available as a standardized unit and do not permit serial synchronization.

SUMMARY OF THE INVENTION

The present invention solves the problems of the prior proximity switches by providing ultrasonic proximity switches, which, after being interconnected, enable an automatic parallel or serial synchronization via their enabling outputs through a shared line.

The present invention achieves this solution by utilizing a proximity switch network having a plurality of synchronizing pulses comprising a shared line, a first proximity switch, and a second proximity switch. The shared line has a first potential state and a second potential state. The first ultrasonic proximity switch includes a first enabling output being connected to the shared line, a first open-loop control block including a first output providing a synchronizing pulse which indicates that the first ultrasonic proximity switch is ready to transmit, and a first input and a first circuit arrangement being electrically connected to the first enabling output, the first output, and the first input. The first circuit arrangement provides a signal at the first input based on the potential state of the first enabling output, and transfers the enabling output to the first potential state while the synchronizing pulse of the first proximity switch is applied and to the second potential state after the termination of all of the plurality of synchronizing pulses. The second ultrasonic proximity switch includes a second enabling output being connected to the shared line, a second input and a second open-loop control block including a second output providing a synchronizing pulse. The synchronizing pulse of the second proximity switch indicates that the second proximity switch is ready to transmit, overlaps the synchronizing pulse of the first proximity switch, and continues after the synchronizing pulse of the first proximity switch has terminated. The second proximity switch also includes a second circuit arrangement being electrically connected to the second enabling output, the second output, and the second input. The second circuit arrangement provides a signal at the second input based on the potential state of the second enabling output, transfers the second enabling output to the first potential state while the synchronizing pulse of the second proximity switch is applied, and transfers the second enabling output to the second potential state after the termination of all of the plurality of synchronizing pulses.

When all synchronizing pulses have terminated, thereby changing the potential of the shared line to the second potential state, the required state change is produced at the first and second inputs to release synchronized initial pulses. Further, this configuration advantageously allows different types of units to be synchronized automatically such that additional time and energy for special adjustments need not be expended. Further, the ultrasonic proximity switches of the present invention can be compact proximity switches having one four-pole plug connection according to the standard VDE0660 part 208. Preferably, the first and second open-loop control blocks are microprocessors. More specifically, the first circuit arrangement further includes an optocoupler, a first voltage source, a transistor, a ground terminal, and a second voltage source. The first enabling input is connectable via the optocoupler to the first voltage source, and via the first transistor to the ground terminal. Further the base of the first transistor is connected to the first output, such that when the first synchronizing pulses are provided at the base of the transistor, the first enabling input is electrically connected to the ground terminal and the optocoupler is connected through so that the first input of the first open-loop control block is connected to the ground terminal. When the optocoupler is not electrically conductive, the first input of the first open-loop control block is connected to the second voltage source and the first enabling input is electrically connected to the first voltage source. In a more specific embodiment, the first ultrasonic proximity switch and the second ultrasonic proximity switch are interconnected via their enabling outputs via the shared line. In an embodiment permitting a serial synchronization, the first and second enabling outputs respectively are connected to the shared line. Each of the first and second proximity switches have a unique address in the form of a time segment stored in their open loop control block. After the termination of the first and second synchronizing pulses, a common temporal starting point is set for the mutual initiation of the start of the various time segments within a predetermined timing window. At the completion of each timing signal, each open-loop control block delivers a priority pulse to its respective circuit arrangement, and the priority pulse is received by all proximity switches connected to the shared line, whereby the sequence of the priority pulses is detected in each proximity switch and at the end of the timing window, the first proximity switch of the sequence emits an initial pulse and initiates a measuring cycle. Following that, the remaining proximity switches run through their measuring cycle, one after the other in the sequence of the priority pulses. Moreover, the ability to control the synchronization operation by means of an external control connectable to the shared line is expedient.

The drawing depicts an exemplified embodiment of the present invention, which is described in greater detail in the following.

DETAILED DESCRIPTION

Figure 1:
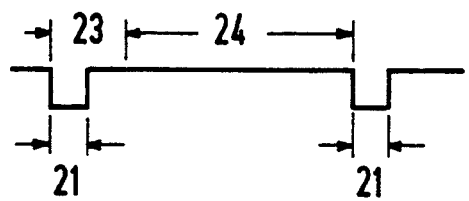
FIG. 1 illustrates a measuring cycle of an ultrasonic proximity switch.

FIG. 1 depicts a measuring cycle of a proximity switch. The cycle begins with the output of an initial pulse 21 of about 150 μs duration. The initial pulse is encompassed by a detecting range 23 of, for example, 4.7 ms. The detecting range is followed by an evaluation duration 24. The length of the evaluation duration 24 varies based on the type of unit and fluctuates within a range of, for example, 10 to 14 ms. As a result of this fluctuation range, the measuring cycles of the proximity switches do not all end at the same time even after a parallel synchronization (i.e., after the initial pulses are mutually transmitted by adjoining ultrasonic proximity switches). Consequently, each ultrasonic proximity switch must be ready before starting a new measuring cycle. Each ultrasonic proximity switch generates its own second synchronizing pulse 7, after the evaluation duration 24 ends, whereby the length of the second synchronizing pulses 7 is selected so that at least two synchronizing pulses 7 or 12 will always partially overlap temporally.

Figure 2:
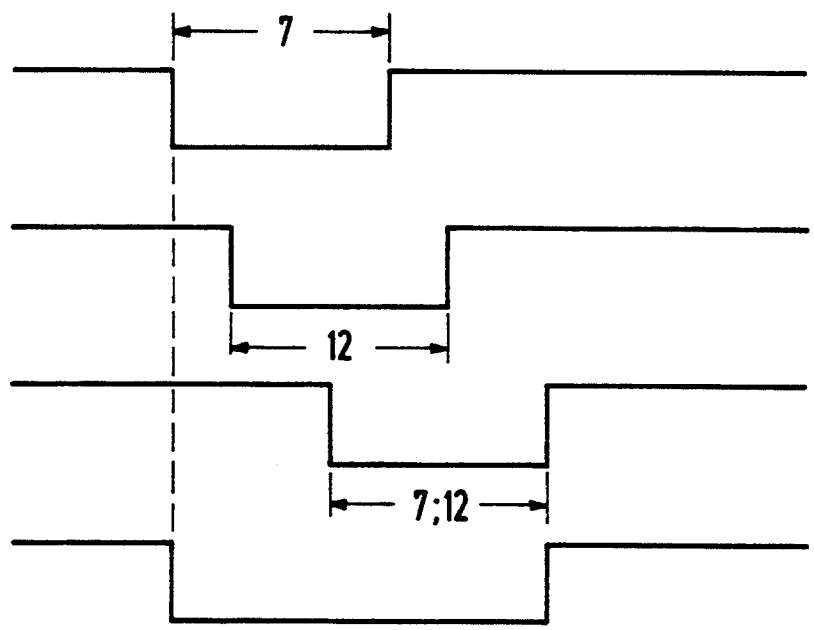
FIG. 2 illustrates a synchronizing pulse grid for operating adjacent ultrasonic proximity switches.

FIG. 2 depicts, as an example, such a grid with synchronizing pulses 7 or 12 from three proximity switches. The synchronizing pulse 7 or 12 is generated in the open-loop control block 4 in the ultrasonic proximity switch 1 realized by a microprocessor (see FIG. 3). Ultrasonic proximity switches 1 operated adjacent to one another are interconnected via their enabling output 3 by a shared line 11. A circuit arrangement 8 is disposed electrically between the microprocessor 4 and the enabling output 3. At its output 6, the microprocessor 4 supplies the synchronizing pulse 7/12 to the circuit arrangement 8. As a result, the circuit arrangement 8 produces a change in potential in the shared line 11, which at the same time gives rise to a corresponding feedback signal to an input 5 of the microprocessor 4 in the ultrasonic proximity switch 1. This means that the potential status on the shared line 11 remains as long as at least a second synchronizing pulse 7/12 remains applied. This is expressed as the total signal, illustrated at the bottom of FIG. 2, which follows from all synchronizing pulses 7 or 12. The condition that all ultrasonic proximity switches 1 on the shared line 11 are not yet ready for operation is thus supplied through the mentioned feedback of the potential state of the shared line 11 to the input 5 from the microprocessor 4 of each ultrasonic proximity switch 1. The shared line 11 goes to another potential state only after the last synchronizing pulse 7 or 12 of the synchronizing-pulse grid. As a result, the input 5 of the microprocessor 4 indicates that all ultrasonic proximity switches 1 are clear to send. This last change in potential is used to introduce the initial pulses 21 in the case of a parallel synchronization.

Figure 3:
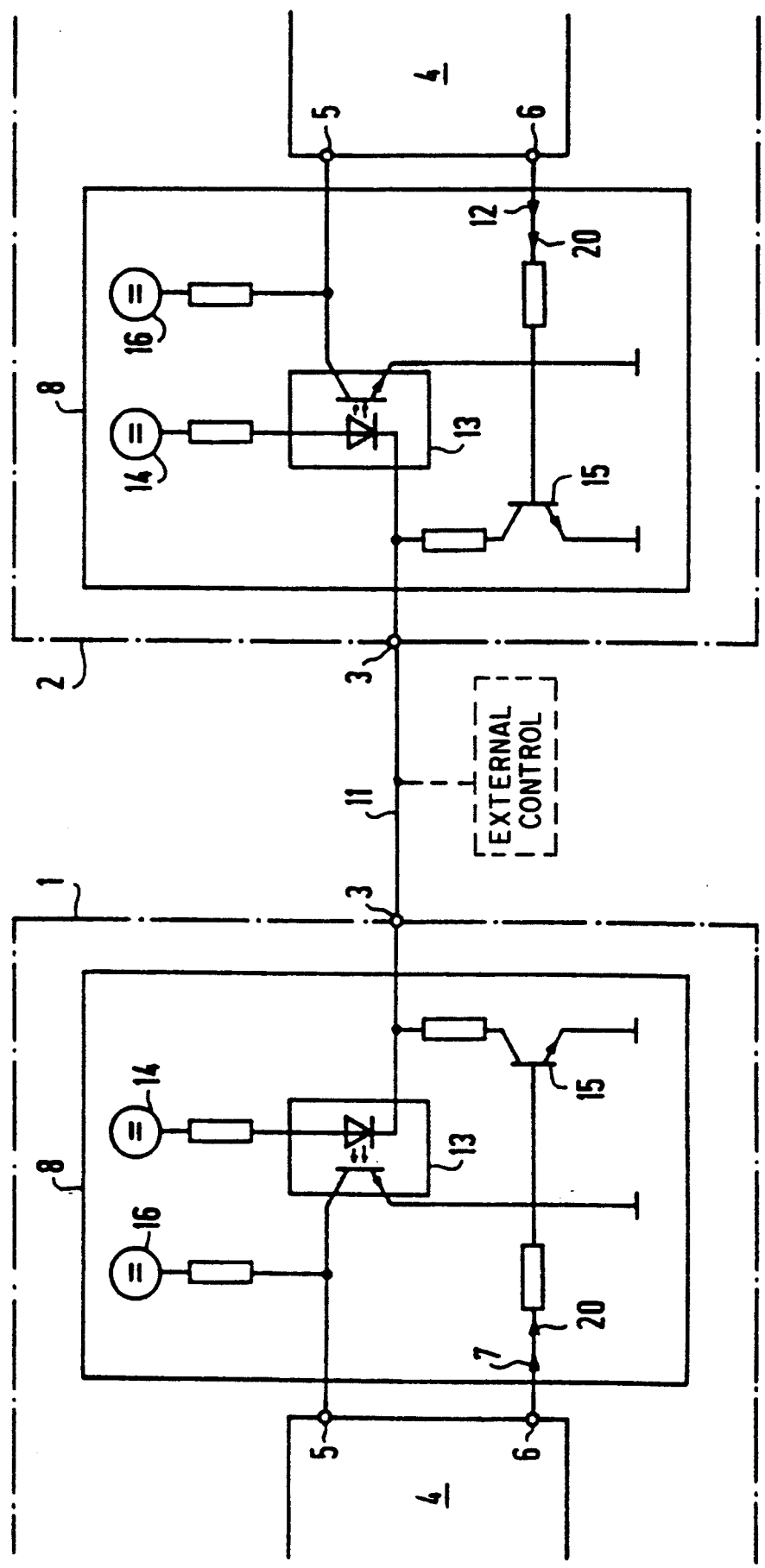
FIG. 3 depicts two proximity switches connected via their enabling output by a shared line.

FIG. 3 depicts two ultrasonic proximity switches 1 and 2 interconnected by their enabling output 3 via a shared line 11. Each ultrasonic proximity switches 1 and 2 includes a microprocessor 4 with an input terminal 5 and an output terminal 6. The circuit arrangement 8 is situated electrically between these terminals and the enabling output 3. A transistor 15 is connected between the enabling output 3 and ground. The base of the transistor 15 is electrically connected to the output 6 of the microprocessor 4 and its collector is electrically connected to a first voltage source 14 via an optocoupler 13. The contact-break distance of the optocoupler 13 is connected, on the one hand, to the input 5 of the microprocessor 4 and via a resistor to a second voltage source 16, as well as, on the other hand, to ground. By feeding a synchronizing pulse 7 generated in the microprocessor 4 to the output 6, the transistor 15 is switched through and, consequently, the line 11 connected to the enabling output 3 is connected to ground. At the same time the transistor 15 is switched through, the optocoupler 13 is connected through and, as a result, the input 5 of the microprocessor 4 is likewise connected to ground. The synchronizing pulses 7 of the interconnected ultrasonic proximity switches 1 overlap temporally at least in part, so that frame potential is applied to the inputs 5 of the microprocessors 4 of all interconnected ultrasonic proximity switches 1 for as long as any synchronizing pulse 7 or 12 is applied. The duration is represented by the lower total pulse in FIG. 2. Only after the last occurring synchronizing pulse 7 or 12 has ended, is the shared line 11 connected to a high potential made available by the first voltage source 14 and, consequently, at the same time, a high potential, which corresponds to the second voltage source 16, is also produced at every input 5 of the microprocessors 4. This last change in potential at the input 5, indicates that all ultrasonic proximity switches 1 are ready to transmit and that the initial pulses 21 (see FIG. 1) of each of the proximity switches can now be emitted at the same instant.

Serial synchronization should be used when the problem of detecting objects at varying distances using adjacent ultrasonic proximity switches 1, is confronted. Here, when the measuring cycle of one proximity switch 1 ends, a further measuring cycle of another adjacent ultrasonic proximity switch begins, so that, in each case, one measurement is always made with only one single ultrasonic proximity switch 1. The ultrasonic proximity switches 1 used have the configuration described for parallel synchronization. With serial synchronization, whether all the ultrasonic proximity switches 1 connected up to a shared line are ready for operation must initially be determined. To make this determination, initially a synchronizing-pulse grid, according to FIG 2 runs off, whereby now, however, at the state transition at the end of the bottom total pulse to high potential, both the shared line 11 and across the input 5 of the microprocessors 4, are used as a starting point 18 (see FIG. 4). Each ultrasonic proximity switch 1 receives an address in the form of a time segment 17, which is stored in the microprocessor 4 and serves, so to speak, as an identifier of the particular ultrasonic proximity switch 1.

Figure 4:
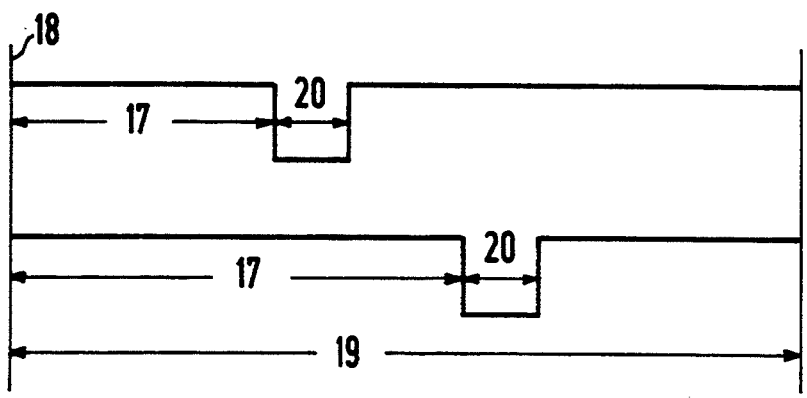
FIG. 4 illustrates a pulse diagram for establishing priority in the case of serial synchronization.

Starting from the mutual starting point 18, the start of these time segments 17 is shown in the pulse diagram of FIG. 4. At the end of each time segment 17, a short priority pulse 20 is emitted which is typical for the specific ultrasonic proximity switch 1. The addresses, that is the time segments 17 and the duration of the priority pulses 20, are selected such that the priority pulses 20 do not overlap temporally. A timing window 19, contains the priority pulses 20 from all adjacent ultrasonic proximity switches 1. The timing window 19 begins to run at the starting point 18. These priority pulses 20 are generated in the microprocessor 4 and are supplied by its output 6 to the circuit arrangement 8 in the same way as the synchronizing pulses in the case of the parallel synchronization. The priority pulses 20 produce a change in potential for the duration of the priority pulse 20, leading to ground on the shared line 11. Thus, the priority pulses 20, lead to a change in potential at the input 5 of the microprocessor 4 in the same way as previously described regarding the synchronizing pulses 7. Thus, via its input 5, each microprocessor 4 receives not only the information when a priority pulse 20 exists in the ultrasonic proximity switch 1 in question, but via the shared line 11, also receives the feedback by way of the priority pulses 20 from the adjacent ultrasonic proximity switches 1. In this manner, each ultrasonic proximity switch 1 is able to notice at what point after the starting point 18 its priority pulse 20 was emitted with its microprocessor 4. As a result, at the end of the timing window 19, the proximity switch with the first emitted priority pulse 20 runs through a measuring cycle and emits an initial pulse, while all remaining proximity switches release their initial pulse, one after another, only when it is their turn based on a predetermined sequence. Serial synchronizing in this manner has the considerable advantage of extremely short delay times, since the operation of the ultrasonic proximity switches is not interrupted, but rather only the transmission of the initial pulses is blocked. As a result, unnecessary reset times which would cause additional time delays are eliminated.

The present invention is well suited for the operation of both the parallel synchronization and the serial synchronization. The present invention is particularly advantageous for compact units where an external control is not used and where a cost-effective device configuration is desired. These types of compact units are usually only equipped with one four-pole plug-in connection, so that only one output is available for synchronization purposes. However, the described configuration also permits an operation with an external control. This control can be connected up to the shared line 11, to permit external control of particular parallel synchronization or serial synchronization.

What is claimed is:

1. A proximity switch network having a plurality of synchronizing pulses comprising:
   a) a shared line, said shared line
      i) having a first potential state and a second potential state;
   b) a first ultrasonic proximity switch, said first ultrasonic proximity switch including
      i) a first enabling output, said first enabling output being connected to said shared line,
      ii) a first open-loop control block, said first open-loop control block including
         A) a first output providing a synchronizing pulse which indicates that said first ultrasonic proximity switch is ready to transmit, and
         B) a first input; and
      iii) a first circuit arrangement, said first circuit arrangement
         A) being electrically connected to said first enabling output, said first output, and said first input,
         B) providing a signal at said first input based on a potential state of said first enabling output, and
         C) bringing said enabling output to said first potential state while said synchronizing pulse of said first proximity switch is applied and to said second potential state after the termination of all of said plurality of synchronizing pulses; and
   c) a second ultrasonic proximity switch; said second ultrasonic proximity switch including
      i) a second enabling output, said second enabling output, being connected to said shared line,
      ii) a second open-loop control block, said second open-loop control block including
         A) a second output providing a synchronizing pulse which indicates that said second proximity switch is ready to transmit, which overlaps said synchronizing pulse of said first proximity switch, and which continues after said synchronizing pulse of said first proximity switch has terminated, and
         B) a second input, and
      iii) a second circuit arrangement, said second circuit arrangement
         A) being electrically connected to said second enabling output, said second output, and said second input,
         B) providing a signal at said second input based on a potential state of said second enabling output, and
         C) bringing said second enabling output to said first potential state while said synchronizing pulse of said second proximity switch is applied and to said second potential state after the termination of all of said plurality of synchronizing pulses, wherein when all synchronizing pulses have terminated, thereby changing the potential of said shared line to said second potential state, the required state change is produced at said first and second inputs to release synchronized initial pulses.

2. The apparatus as claimed in claim 1 wherein said first and second open-loop control blocks are microprocessors.

3. The apparatus as claimed in claim 1 wherein said first circuit arrangement further includes:
   i) an optocoupler;
   ii) a first voltage source;
   iii) a transistor;
   iv) a ground terminal; and
   v) a second voltage source, wherein said first enabling input is connectable
      i) via said optocoupler to said first voltage source, and
      ii) via said first transistor to said ground terminal,
   wherein the base of said first transistor is connected to said first output, such that when said first synchronizing pulses are provided at the base of said transistor, said first enabling input is electrically connected to said ground terminal and said optocoupler is connected through so that said first input of said first open-loop control block is connected to said ground terminal, and
   wherein when said optocoupler is not electrically conductive, said first input of said first open-loop control block is connected to said second voltage source and said first enabling output is electrically connected to said first voltage source.

4. The apparatus as claimed in claim 3 wherein said first ultrasonic proximity switch and said second ultrasonic proximity switch are interconnected via their enabling outputs via said shared line.

5. The apparatus as claimed in claim 1 wherein said first and second enabling output respectively are connected to said shared line,
   wherein each of said first and second proximity switches have a unique address in the form of a time segment stored in their open loop control block,
   wherein after the termination of said first and second synchronizing pulses, a common temporal starting point is set for the mutual initiation of the start of the various time segments within a predetermined timing window,
   wherein at the completion of each timing signal, each open-loop control block delivers a priority pulse to its respective circuit arrangement, and said priority pulse is received by all proximity switches connected to shared line, whereby a sequence of the priority pulses is detected in each proximity switch and at the end of said timing window, the first proximity switch of the sequence emits an initial pulse and initiates a measuring cycle and following that, the remaining proximity switches run through their measuring cycle, one after the other in the sequence of the priority pulses.

6. The apparatus as claimed in claim 4 wherein said synchronization is effected by means of external control, said means of external control being connected to said shared line.

* * * * *